United States Patent [19]
Shigekane

[11] Patent Number: 4,651,035
[45] Date of Patent: Mar. 17, 1987

[54] COMPOUND DIVERSE TRANSISTOR SWITCHING CIRCUIT

[75] Inventor: Hisao Shigekane, Nagano, Japan

[73] Assignee: Fuji Electric Co., Ltd., Kawasaki, Japan

[21] Appl. No.: 785,878

[22] Filed: Oct. 9, 1985

[30] Foreign Application Priority Data

Nov. 11, 1984 [JP] Japan ................................ 59-238899
Nov. 13, 1984 [JP] Japan ................................ 59-238900

[51] Int. Cl.⁴ .......................................... H03K 17/687
[52] U.S. Cl. .................................... 307/570; 307/571; 307/581
[58] Field of Search ................. 307/570, 580, 581, 315

[56] References Cited

U.S. PATENT DOCUMENTS 3,610,960 10/1971 Hofstein .............................. 307/570
4,425,516 1/1984 Wanlass ............................... 307/570
4,487,457 12/1984 Janatka ................................ 307/570

Primary Examiner—Stanley D. Miller
Assistant Examiner—B. P. Davis
Attorney, Agent, or Firm—Brumbaugh, Graves, Donohue & Raymond

[57] ABSTRACT

A switching circuit which uses a compound transistor pair as the switch employs to improve the switching properties a circuit branch which comprises an auxiliary transistor and a zener diode. In a preferred embodiment, the branch also included a voltage-divider resistor network to control the maximum current through the switch.

7 Claims, 4 Drawing Figures

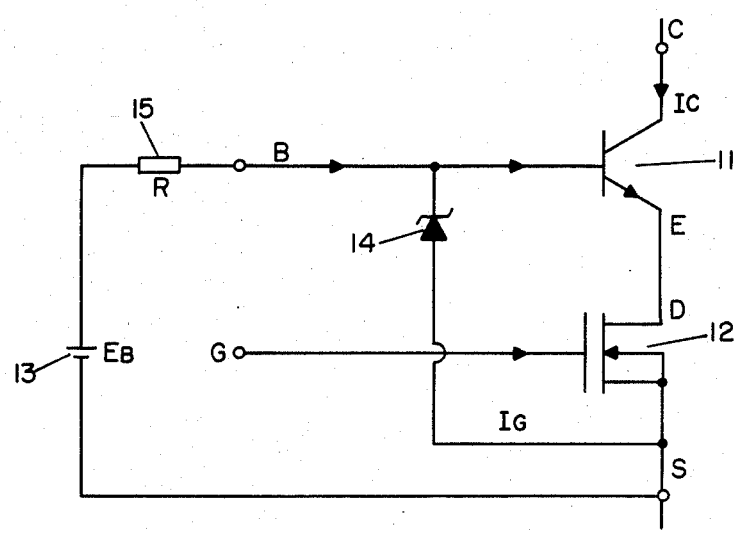
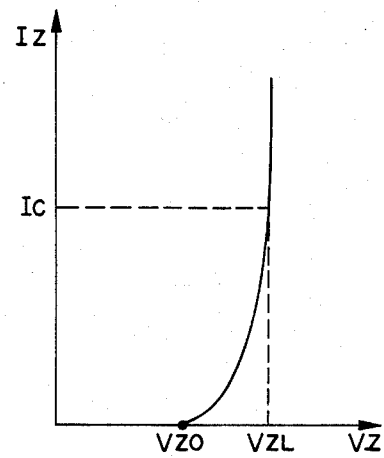
FIG. 1
PRIOR ART
FIG. 2
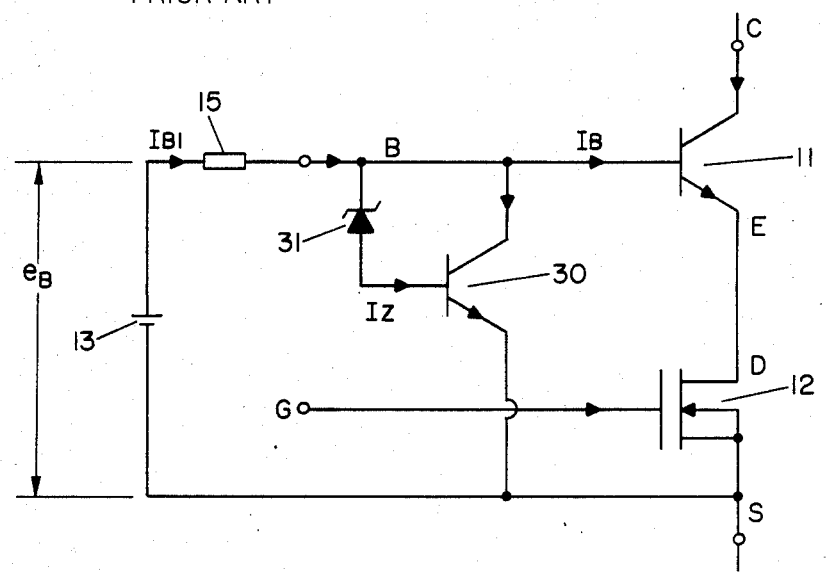
FIG. 3
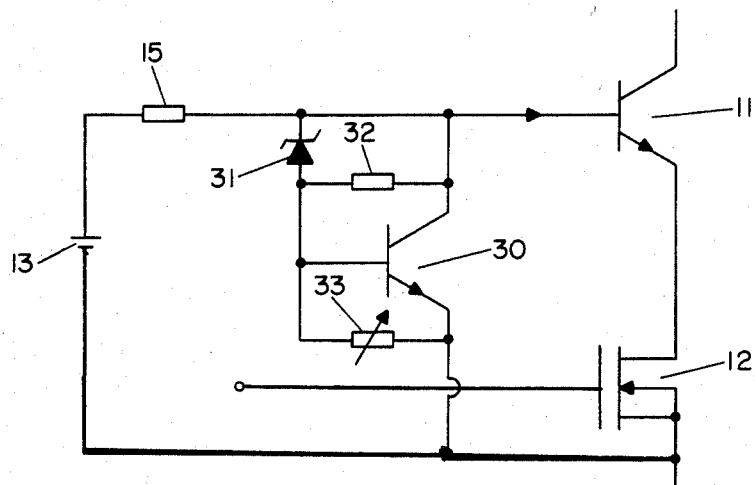
FIG. 4

COMPOUND DIVERSE TRANSISTOR SWITCHING CIRCUIT

FIELD OF THE INVENTION

This invention relates to a semiconductive switching circuit.

BACKGROUND OF THE INVENTION

Compound transistor pairs consisting of a bipolar transistor and a field effect transistor in a cascade arrangement are well known. They seek to combine the speed of a field effect transistor with the voltage handling capacity of a bipolar transistor. It has also been known to connect a zener diode, a voltage reference device, in parallel between the base of the bipolar transistor and the source of the field effect transistor for improving the switching properties of the transistor pair.

However, because the ordinary zener diode tends to have a high working resistance when designed to have a low zener voltage, this has not proved completely satisfactory. Alternatively, instead of a single zener diode, there has been employed in the same fashion a series of forward-biased diodes. However, such an arrangement suffers from the fact that the breakdown is soft rather than sharp and as a result the losses cannot be kept small.

The present invention seeks to improve the switching properties of a compound transistor pair by combining it with circuitry which essentially provides the ideal zener characteristic where needed.

Additionally in a preferred embodiment, the invention provides an arrangement which facilitates limiting the maximum current which can flow through the compound transistor pair.

SUMMARY OF THE INVENTION

In the invention, the simple zener diode is replaced by a circuit which comprises an auxiliary transistor, either of the bipolar or field-effect type, whose two main current-handling terminals are connected to the base of the bipolar transistor portion of the compound transistor pair and the source of the FET of the compound transistor pair, respectively and a zener diode is connected between the base of the bipolar transistor of the compound transistor pair and the control terminal of the auxiliary transistor. As is known, the source and drain constitute the two main current-handling terminals of an FET, and the emitter and collector of a bipolar transistor serve this role. The control terminal is the gate in an FET and the base in a bipolar transistor.

Additionally, in the preferred embodiment, the replacement circuit further comprises a first resistor connected between one of the two main current-handling terminals and the control terminal of the auxiliary transistor and a second resistor connected between the other of the main current-handling terminals and the control terminal of the auxiliary transistor and one of these resistors may be variable to better approach ideal operating conditions. By such additions, properly adjusted, the current flowing through the compound transistor pair can be limited to a desired upper limit.

BRIEF DESCRIPTION OF THE DRAWING

FIG. 1 shows the prior art circuit.

FIG. 2 shows the voltage-current characteristic of a zener diode and is useful in explaining the problem with the prior art.

FIGS. 3 and 4 show different embodiments of the invention.

DETAILED DESCRIPTION

FIG. 1 shows the prior art arrangement on which the invention improves. The compound transistor pair comprises the bipolar transistor 11, shown as an NPN, and the FET 12, shown as an N-channel type. The circuit is powered by voltage supply 13 connected between the base B of transistor 11 and the source S of transistor 12. Switching voltage is applied to the gate G of transistor 12 and the load (not shown) is connected in series with transistors 11 and 12 to receive collector current $I_C$. The zener diode 14 is connected between the base of transistor 11 and the source of transistor 12 poled to have its cathode terminal connected to the base of transistor 11. A current-limiting resistor 15 is generally included.

Such a circuit is designed so that its switching speed is largely determined by the relatively fast switching speed of an FET and its ability to handle high operating voltages is largely provided by the ability of the bipolar transistor to withstand high operating voltages supplied by the source 13.

For turning on the pair, a switching voltage is applied to the gate of transistor 12, quickly turning it on whereby the voltage drop $V_{DS}$ across the drain and source of transistor 12 falls sharply, allowing the voltage provided by supply 13 to be applied largely to the base of the transistor for providing a forward bias to its emitter whereby a large base current is supplied and the transistor 11 and in turn the compound pair can be turned on sharply.

For turning off the transistor pair, turn-off voltage is applied to the gate of transistor 12, to turn it off. As a result, the current $I_C$ which had been flowing through the base and emitter of transistor 11 is temporarily shifted into the zener diode 14 whereby storage of carriers in the base of the transistor 11 is avoided and the transistor 11 and in turn the compound pair can be turned off rapidly whereby the current $I_C$ also can be turned off rapidly.

One role of the zener diode 14 is, as a voltage reference device, to maintain the voltage drop $V_{DS}$ below its blocking voltage $BV_{DS}$, at which voltage it can turn off, at the time of switching the collector current $I_C$. The other role is to serve as a high resistance path while the compound pair is conducting to divert little of the current being supplied by the supply 13.

It is usually the case that the higher the blocking voltage $BV_{DS}$ of an FET is designed for, the higher the ON voltage drop across the FET. Since the latter is desirably small for low losses, it is generally preferable to employ FETs with low $BV_{DS}$ characteristics.

Assuming that the current $I_C$ can be shifted entirely from the base and emitter of the bipolar transistor into the zener diode at the turn-off time of the pair, the voltage $BV_{DS}$ is represented by the following equation $$BV_{DS} \geq V_{ZL} - V_{BE10} \tag{1}$$

where $V_{ZL}$ is the voltage across the diode when a load current equal to $I_C$ flows through, and $V_{BE10}$ is the forward voltage drop across the base-emitter of the bipolar transistor immediately before the collector current passing through the base and emitter ceases.

On the other hand, the foregoing loaded zener voltage $V_{ZL}$, in the state where the current $I_C$ is flowing into the diode in the blocking direction, is given by $$V_{ZL} = V_{ZO} + R_Z I_C \qquad (2)$$

where $V_{ZO}$ is the voltage across the diode just before it starts to conduct and $R_Z$ is the characteristic effective resistance of the diode. FIG. 2 illustrates this.

As a general rule, the lower the blocking voltage $BV_{DS}$ of an FET is, the lower the ON voltage (the voltage across the FET when $I_C$ is flowing through) can be. For low losses, therefore, a low $BV_{DS}$ is desired. The last equation indicates that for a low $BV_{DS}$, a diode of low $V_{ZO}$ and low resistance is desired. However, the ordinary zener diode with a low $V_{ZO}$ tends to have a high $R_Z$. For this reason, a circuit employing a series of diodes connected in the forward direction can be employed as the equivalent of a zener diode to achieve a better combination of low $V_{ZO}$ and low $R_Z$. However, such an arrangement tends to have a very soft breakdown characteristic and the unloaded zener voltage $V_{ZO}$ is considerably lower than the voltage drop when a current $I_C$ flows through.

Moreover, since at the turn-on time of the pair, the base current supplied from the supply 13 can be applied as the base current to the main transistor without flowing into the zener diode, the voltage $V_{ZO}$ must satisfy the following condition $$V_{ZO} \geq V_{BE(Sat)} + V_{DSON} \qquad (3)$$

where $V_{BE(Sat)}$ is the base-emitter forward voltage drop of the main transistor when the transistor is on, and $V_{DSON}$ is the voltage drop across the FET when it is on.

If a zener diode is selected to satisfy the last equation, its loaded zener voltage also becomes high, and this in turn results in a high $BV_{DS}$ and so a high $V_{DSON}$ and high losses.

The circuit invention is designed to avoid this dilemma. It permits use of a zener diode with as low a $V_{ZO}$ as possible, consistent with its satisfying the conditions of equation (3) above. It is characteristic of this circuit that it provides a circuit whose characteristics are essentially those of an ideal zener diode with the unloaded zener voltage $V_{ZO}$ closely matching the loaded zener voltage $V_{ZL}$.

FIG. 3 shows the basic form of the invention. Elements corresponding to elements in the prior art circuit shown in FIG. 1 have been given the same reference numerals. The distinctive feature is the inclusion of the circuit branch made up of auxiliary transistor 30, shown here as a bipolar NPN transistor, and the zener diode 31. As shown, the collector of transistor 30 is connected to the base of transistor 11 and the emitter to the source of transistor 12. The cathode of zener diode 31 is connected to the base of transistor 11 and the anode to the base of the transistor 30.

In this circuit, during the ON state of the pair, little current flows through the diode or the auxiliary transistor, and the current supplied by supply 13 serves entirely as the base current of the main transistor.

At the turn-off time of the compound pair, the current $I_C$ is switched into the equivalent zener diode circuit branch. In particular, the voltage across diode 31 rises and when it exceeds $V_{ZO}$, zener current starts to flow, which in turn provides base current to the auxiliary transistor 30 which then conducts. As a result, most of the current $I_C$ being switched flows in the auxiliary transistor and the zener current $I_Z$ remains less than the current $I_C$ and, accordingly, the voltage across the zener diode and in turn the base voltage of the transistor 11 is also held at a value near to the unloaded zener voltage $V_{ZO}$ of the diode 31. Accordingly, by treating the base voltage at this time as the loaded zener voltage of the ideal zener diode, the condition of equation 1 is satisfied.

Generally, a cascade pair arrangement of the kind here involved has the function of limiting the current flowing through the pair. When the compound pair is ON, the ON voltage $V_{DSON}$ of the FET 12 is given by $$V_{DSON} = R_{DS} I_C + V_{DSO} \qquad (4)$$

where $V_{DSO}$ is the unloaded ON voltage and $R_{DS}$ is a characteristic resistance of the FET.

By combining equations 3 and 4, it follows that $$V_{ZO} \geq V_{BE(Sat)} + R_{DS} I_C + V_{DSO} \qquad (5)$$

This can be rewritten as $$I_C \geq (V_{ZO} - V_{BE(Sat)} - V_{DSO})/R$$

Therefore, by choosing for diode 31 one having an appropriate value of $V_{ZO}$, it is possible to limit the value of current I.

However, because the characteristic resistance of FET 12 tends to vary widely, the limiting value of $I_C$ cannot be controlled simply.

The preferred embodiment shown in FIG. 4 remedies this problem. This embodiment differs from the previous embodiment by the inclusion of a high valued resistor 32 between the base and collector of the transistor 30 and a high-valued variable resistor 33 between the base and emitter of the transistor 30 to form a voltage-divider branch. In this circuit, when the collector circuit $I_C$ is at the desired limit value, the auxiliary transistor is maintained at the point just before it starts to let flow its current $I_{C3}$ by means of resistors 32 and 33. This is best done by choosing resistor 32 to be of fixed high value and resistor 33 of high adjustable value, and adjusting it to achieve the desired result. Essentially this means that resistors 32 and 33 are chosen such that when the compound transistor pair is ON, essentially all the current that flows from supply 13 flows into the base of transistor 11.

If the described condition is obtained, when the collector current $I_C$ tries to exceed its limit value, the collector-emitter voltage of transistor 30 will tend to rise, and its base-emitter voltage also will tend to rise. As a result, base current starts to flow in transistor 30 and this comes at the expense of the base current in transistor 11. It accordingly is reduced and in turn the tendency of the collector current flowing through the pair to increase is reduced, which is the desired result.

Moreover, in the course of turning off the compound pair, the collector-emitter voltage of transistor 30 rises more rapidly than in the case where the pair is in the ON state, and the zener diode 31 comes into conduction and the zener current joins the base current of transistor 30. Accordingly, while the collector-emitter voltage on transistor 30 is maintained substantially constant as described previously, most of the current $I_C$ diverted from the pair changes into collector current of transistor 30 whereby a high speed turning-off is achieved.

It is of course apparent that although the described embodiments employ NPN bipolar transistors and N-channel FET's, the complementary forms can be employed by suitable modifications known to the worker in the art. Moreover the invention should be useful with other forms of voltage reference devices which haves soft breakdown characteristics.

I claim:

1. A semiconductive switching device comprising a compound transistor pair comprising a bipolar transistor and a field effect transistor connected to form a series circuit of the emitter and collector of the bipolar transistor and the source and drain of the field effect transistor said series circuit being connected between a pair of output terminals, an auxiliary transistor including a pair of main current-handling terminals and a control terminal, one of the pair of current-handling terminals being connected to the source of the field effect transistor and the other to the base of the bipolar transistor, voltage reference diode means connected between the base of the bipolar transistor and the control terminal of the auxiliary transistor poled to block control terminal current in the auxiliary transistor, and an input terminal to which is connected the gate of the field effect transistor and to which is to be supplied the input switching signal.

2. The device of claim 1 in which the auxiliary transistor is a bipolar transistor and said one terminal being its emitter, the other terminal its collector and the control terminal its base.

3. The device of claim 1 in which the auxiliary transistor is a field effect transistor.

4. The device of claims 1, 2 or 3 in which the voltage reference diode means is a zener diode.

5. The device of claim 1 in combination with voltage supply means and current limiting resistance means connected serially between the base of the bipolar transistor and the source of the field effect transistor, and said pair of output terminals connected to the source of the field effect transistor and the collector of the bipolar transistor, respectively.

6. The combination of claim 5 in further combination with a first resistance means connected between the control terminal and one current handling terminal of the auxiliary transistor and a second resistance means connected between the control terminal of the auxiliary transistor and the other current handling terminal of the auxiliary transistor.

7. The combination of claim 6 in which the auxiliary transistor is a bipolar transistor of the same type as the first-mentioned bipolar transistor and its collector is connected to the base of the first-mentioned bipolar transistor and its emitter is connected to the source of the field-effect transistor.

* * * * *

UNITED STATES PATENT AND TRADEMARK OFFICE
CERTIFICATE OF CORRECTION

PATENT NO. : 4,651,035

DATED : March 17, 1987

INVENTOR(S) : Hisao Shigakane

It is certified that error appears in the above-identified patent and that said Letters Patent is hereby corrected as shown below:

First page, 2nd line of Item 30, "Nov. 11, 1984" should read --Nov. 13, 1984--.

Signed and Sealed this

Eleventh Day of August, 1987

Attest:

DONALD J. QUIGG

Attesting Officer

Commissioner of Patents and Trademarks